United States Patent

Alwardi et al.

(10) Patent No.: US 10,274,510 B2
(45) Date of Patent: Apr. 30, 2019

(54) CANCELLATION OF NOISE DUE TO CAPACITANCE MISMATCH IN MEMS SENSORS

(71) Applicant: STMicroelectronics, Inc., Coppell, TX (US)

(72) Inventors: Milad Alwardi, Allen, TX (US); Deyou Fang, Frisco, TX (US)

(73) Assignee: STMicroelectronics, Inc., Coppell, TX (US)

( * ) Notice: Subject to any disclaimer, the term of this patent is extended or adjusted under 35 U.S.C. 154(b) by 558 days.

(21) Appl. No.: 15/019,453

(22) Filed: Feb. 9, 2016

(65) Prior Publication Data

US 2017/0227569 A1 Aug. 10, 2017

(51) Int. Cl.
| | | |
|---|---|---|
| *G01P 15/125* | (2006.01) | |
| *G01R 27/26* | (2006.01) | |
| *G01D 5/241* | (2006.01) | |
| *G01C 19/5776* | (2012.01) | |

(52) U.S. Cl.
CPC ........ *G01P 15/125* (2013.01); *G01C 19/5776* (2013.01); *G01D 5/2417* (2013.01); *G01R 27/2605* (2013.01)

(58) Field of Classification Search
CPC ...... G01P 15/125; G01P 15/13; G01P 15/131; G01P 15/18; G01R 27/2605; G01D 5/2417
See application file for complete search history.

(56) References Cited

U.S. PATENT DOCUMENTS

| | | | | |
|---|---|---|---|---|
| 6,035,694 A | * | 3/2000 | Dupuie ................ | G01P 15/125 73/1.38 |
| 6,731,121 B1 | * | 5/2004 | Hsu ........................ | G01D 5/24 324/678 |
| 9,983,032 B1 | * | 5/2018 | Kraver .................. | G01D 18/00 |
| 2002/0143484 A1 | * | 10/2002 | Chiesa .................. | G01D 3/066 702/94 |
| 2007/0163815 A1 | * | 7/2007 | Ungaretti .............. | G01P 15/125 178/18.06 |
| 2010/0188105 A1 | * | 7/2010 | Khanna .................... | G01D 5/24 324/658 |
| 2010/0219848 A1 | * | 9/2010 | Gotoh ...................... | G01D 1/00 324/686 |
| 2014/0015544 A1 | * | 1/2014 | Nezuka .............. | G01R 27/2605 324/603 |
| 2014/0300415 A1 | * | 10/2014 | Casiraghi ............ | G01P 15/0802 330/260 |
| 2016/0077126 A1 | * | 3/2016 | Jeong ...................... | G01P 21/00 702/104 |
| 2018/0011125 A1 | * | 1/2018 | Oshima ................ | G01P 15/125 |

* cited by examiner

*Primary Examiner* — Helen C Kwok
(74) *Attorney, Agent, or Firm* — Crowe & Dunlevy

(57) ABSTRACT

Disclosed herein is a device including a MEMS sensor configured to generate a first differential capacitance representing a change in capacitance from a first original sensing capacitance value and a second differential capacitance representing a change in capacitance from a second original sensing capacitance value, with the first and second original sensing capacitance values being mismatched. A compensation circuit is configured to generate outputs for compensating the first and second differential capacitances for the mismatch. A capacitance to voltage converter receives the first and second differential capacitances and the outputs of the compensation circuit as input and generates an output voltage as a function thereof.

16 Claims, 4 Drawing Sheets

| Tone Rejection Ratio (dB) | | | |
|---|---|---|---|
| | ΔC0 = 0 | ΔC0 = 50fF | ΔC0 = 50fF |
| Tone Frequency | Tone On VROT Only | Tone On VROT Only | Tone On VROT + RDAC |
| 5 KHz | -168.6 | -23 | -51.4 |
| 200 KHz | -131.6 | -23.3 | -42 |
| 2000 KHz | -100.4 | -26.8 | -33.4 |

CANCELLATION OF NOISE DUE TO CAPACITANCE MISMATCH IN MEMS SENSORS

TECHNICAL FIELD

This disclosure is related to the field of MEMS sensors and, more particularly, to the compensation of MEMS sensors having internal components with capacitance mismatches.

BACKGROUND

Modern portable electronic devices, such as tablets, smartphones, smartwatches, and hybrid devices utilize a variety of small internal sensors to determine information about a condition of the device. For example, accelerometers may be used to determine that the device is under movement or that the device has been moved in a certain gesture, gyroscopes may be used to determine that the physical orientation of the device has changed, etc.

These small internal sensors may be microelectromechanical systems ("MEMS") sensors. MEMS sensors typically include a stationary portion, which may be referred to as a stator, and a portion which may move, which may be referred to as a rotor. As the rotor moves with respect to the stator, the capacitance between the two, or between the stator and a variety of pieces attached to the rotor, changes. By measuring this capacitance or these capacitances, depending on the kind and configuration of sensor, the information about the condition of the device is determined based on the capacitance or capacitances.

Precise determination of this information is desirable. Therefore, further development in this area is desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A device includes a MEMS sensor configured to generate a first differential capacitance representing a change in capacitance from a first original sensing capacitance value and a second differential capacitance representing a change in capacitance from a second original sensing capacitance value, with the first and second original sensing capacitance values being mismatched. A compensation circuit is configured to generate outputs for compensating the first and second differential capacitances for the mismatch. A capacitance to voltage converter receives the first and second differential capacitances and the outputs of the compensation circuit as input and generates an output voltage as a function thereof.

A method aspect is directed to a method that includes receiving from a MEMS sensor a first differential capacitance representing a change in capacitance from a first original sensing capacitance value and a second differential capacitance representing a change in capacitance from a second original sensing capacitance value, with the first and second original sensing capacitance values being mismatched. The method also includes compensating the first and second differential capacitances for the mismatch, and generating an output as a function of the first and second differential capacitances.

A further method aspect is directed to a method that includes supplying a MEMS sensor having two non-stationary components that move with respect to a stationary component with a supply signal. The method also includes measuring differential capacitances representing changes in capacitance from original sensing capacitance values, using a capacitance to voltage converter, with the original sensing capacitance values are mismatched, and using a compensation circuit supplied by the supply signal to compensate the differential capacitances for the mismatch.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Notwithstanding that the numerical ranges and parameters setting forth the broad scope of the disclosure are approximations, the numerical values set forth in the specific examples are reported as precisely as possible. Any numerical value, however, inherently contains certain errors resulting from the standard deviation found in their respective testing measurement. Moreover, the ranges disclosed herein are to be understood to encompass any and all sub-ranges subsumed therein.

Figure 1:
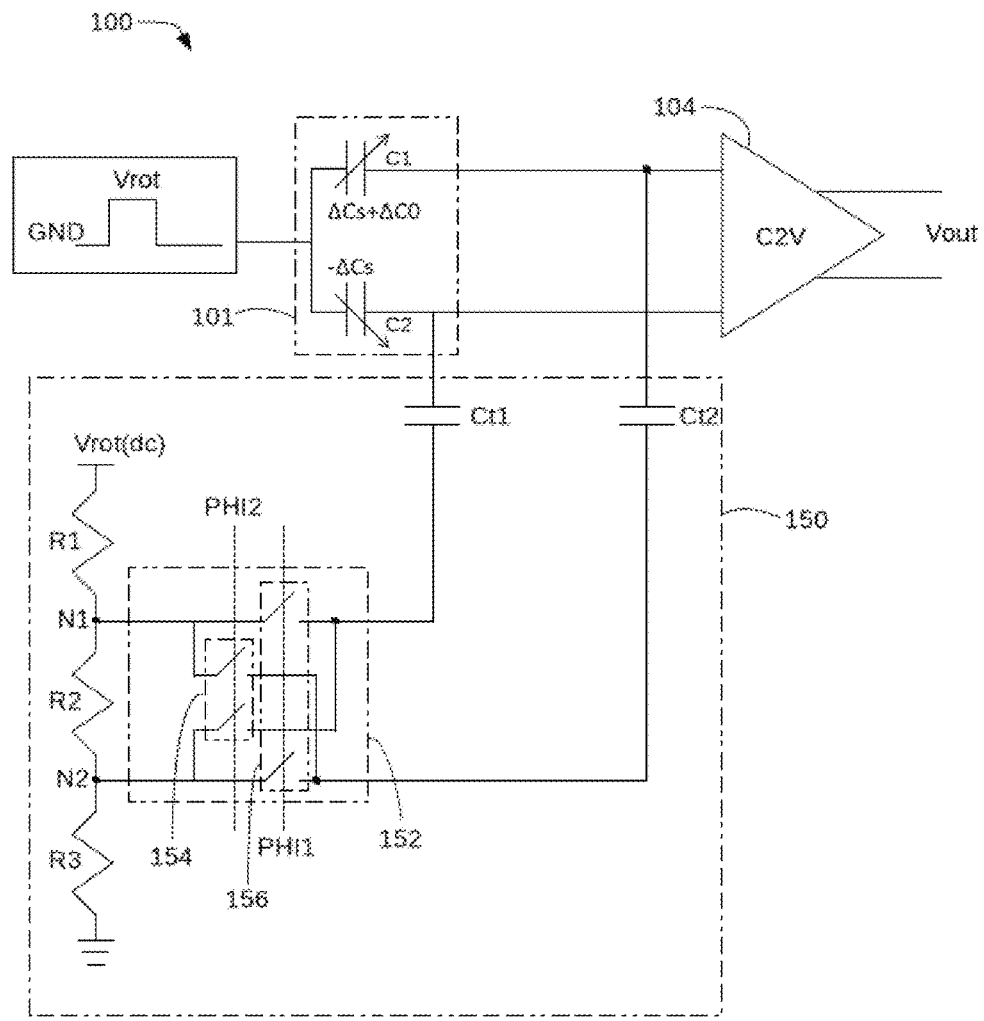
FIG. 1 is a schematic block diagram of an exemplary embodiment of an electronic device disclosed herein.

With reference to FIG. 1, an electronic device 100 is now described. The electronic device 100 is suitable for use in any portable electronic device, such as a smartphone, tablet, smartwatch, or headset. The electronic device 100 includes a microelectromechanical system (MEMS) sensor 101, which may be an accelerometer, gyroscope, microphone, barometer, or any other MEMS device has two or more outputs at which a capacitance is present. As understood by those of skill in the art, MEMS sensors include a rotating or moving element and a stationary element. Conductive members are coupled to the rotating element such that different capacitances between the conductive members and the stationary element are formed during rotation. These capacitors formed by these conductive members have a sensing capacitance C0 (i.e. what the capacitance is expected to be under "normal" conditions) that varies by a capacitance change ΔCs.

These capacitances may be electrically coupled together in various configurations, such as a half bridge, and may function to sense signals of a low bandwidth from DC to a few hundred Hertz. For example, a typical sensing capacitance C0 is on the order of 1 pF, while a typical capacitance change ΔCs is on the order of tens of nF.

The capacitances can be measured under various "changed" conditions, and from these measurements, information about the condition of the device (i.e. acceleration, orientation, pressure, etc) may be determined. For example, the difference between the capacitances at different points in time, or the difference between the capacitances and baseline C0 values may be used to determine the information. Due to manufacturing variability, under conditions in which two or more of these capacitances should be equal, they may be unequal. This inequality will herein be referred to as a capacitance mismatch.

Noise from the rotor is typically reduced or minimized to meet a desired given system performance, however, in the presence of the capacitance mismatch, a residual differential noise from the rotor is passed through to the MEMS sensor 101, which in turn raises the total output noise level.

In the embodiment show in FIG. 1, the MEMS sensor 101 is supplied with a rotor voltage or variable drive voltage Vrot from a supply signal, although it should be understood that the MEMS sensor may instead be supplied with a stator voltage. A pair of differential capacitances, C1 and C2, are read at the outputs of the MEMS sensor 101. The differential capacitances C1 and C2 represent changes in capacitance from baseline values or original sensed capacitance values, for example caused when the MEMS sensor 101 is a gyroscope and its orientation (and thus orientation of the electronic device 100) changes. The changes in capacitance are denoted as ΔCs, with C1 representing the positive portion of the change +ΔCs and C2 representing the negative portion of the change −ΔCs. The capacitance mismatch is represented as ΔC0, and thus for example, C1 can be represented as ΔCs+ΔC0, with C2 represented as −ΔCs.

The differential capacitances C1 and C2 are fed to inputs of a capacitance to voltage amplifier 104, which outputs a differential voltage Vout proportional to the capacitances C1 and C2 at its input. The mismatch may result in a DC offset or charge injection on the inputs of the capacitance to voltage amplifier 104. In addition, the rotor voltage Vrot injects noise to the inputs of the capacitance to voltage amplifier 104.

A compensation circuit 150 is configured to compensate the first and second differential capacitances C1 and C2 for the mismatch such as by generating a compensation signal opposite in sign to the DC offset and feeding it to the inputs of the capacitance to voltage amplifier 104, or by injecting a charge to the inputs of the capacitance to voltage amplifier 104 that counteracts the charge injection that resulted from the mismatch.

The compensation circuit 150 is a resistive digital to analog converter (DAC) whose thermal noise is substantially less than the noise injected from the supply signal. The DAC 150 is powered by the rotor voltage Vrot and generates two different output voltages VDAC1 and VDAC2, which can each span the range of 0 to ±Vrot. This scheme allows the utilization of compensation capacitances to cancel out the mismatch ΔC0.

The DAC 150 includes a voltage divider formed from resistors R1, R2, and R3. Resistor R1 is coupled between the rotor voltage Vrot and a first node N1, while resistor R2 is coupled between the first node N1 and a second node N2, and resistor R3 is coupled between the second node N2 and ground. The resistors R1, R2, and R3 may each have the same value, or they may take different values in some applications.

The DAC 150 is comprised of a switched circuit 152 that couples the first and second nodes N1 and N2 to the inputs of the capacitance to voltage converter 104 through compensation capacitors Ct as a function of a first control signal using first switches 154. The compensation capacitors Ct have a same polarity as Vrot, thus enabling the noise cancellation to occur in phase as the Vrot noise injection through the C0 mismatch.

The first control signal PHI1 is generated as a function of the rotor voltage Vrot, whereas the second control signal PHI2 is generated as a function of a complement of the rotor voltage Vrot. When Vrot is high, then PHI1 is high and switches 156 close to pass the voltages at nodes N1 and N2 respectively to the non-inverting and inverting inputs of the capacitance to voltage amplifier 104. When Vrot is low, then PHI2 is high and switches 154 close to pass the the voltages at nodes N1 and N2 respectively to the inverting and non-inverting inputs of the capacitance to voltage amplifier 104.

The signal and noise transfer function is given by:

$$\Delta Vout = Vrot \frac{\Delta Cs}{Cint} \qquad (1)$$

where Vrot is rotor voltage, ΔCs is the capacitance change due to an event (acceleration, rotation, pressure, etc.), and Cint is the integration capacitance of the capacitance to voltage amplifier 104. A similar equation for the DAC 150 can be written as:

$$dVout = (VDAC1 - VDAC2) \frac{Ct}{Cint} \qquad (2)$$

where VDAC1 and VDAC2 are the differential DAC 150 outputs, and Ct is the capacitance of the coupling capacitors that compensate for ΔC0.

The capacitors Ct have values on the order of 50-100 fF. As explained, the mismatch ΔC0 may cause a system offset. To cancel this offset, the DAC 150 generates the voltages VDAC1 and VDAC2 to satisfy the following equation:

$$Vrot(\Delta C0) = -Ct(VDAC1 - VDAC2) \qquad (3)$$

It should be noted that when ΔC0 is zero, and thus there is no capacitance mismatch, VDAC1−VDAC2=0. As ΔC0 increases, the term VDAC1−VDAC2 increases in order to satisfy the above equation. When ΔC0 changes polarity, the R-DAC is capable of changing polarity of the differential output and to equation 3 satisfied.

Thus, VDAC1 and VDAC2 are generated from, as described above, a voltage divider from Vrot and each carries a fraction of the Vrot noise magnitude with a high degree of correlation. Therefore, a large noise reduction can be achieved, similar to the offset cancellation provided to compensate the ΔC0 mismatch.

Figure 2:
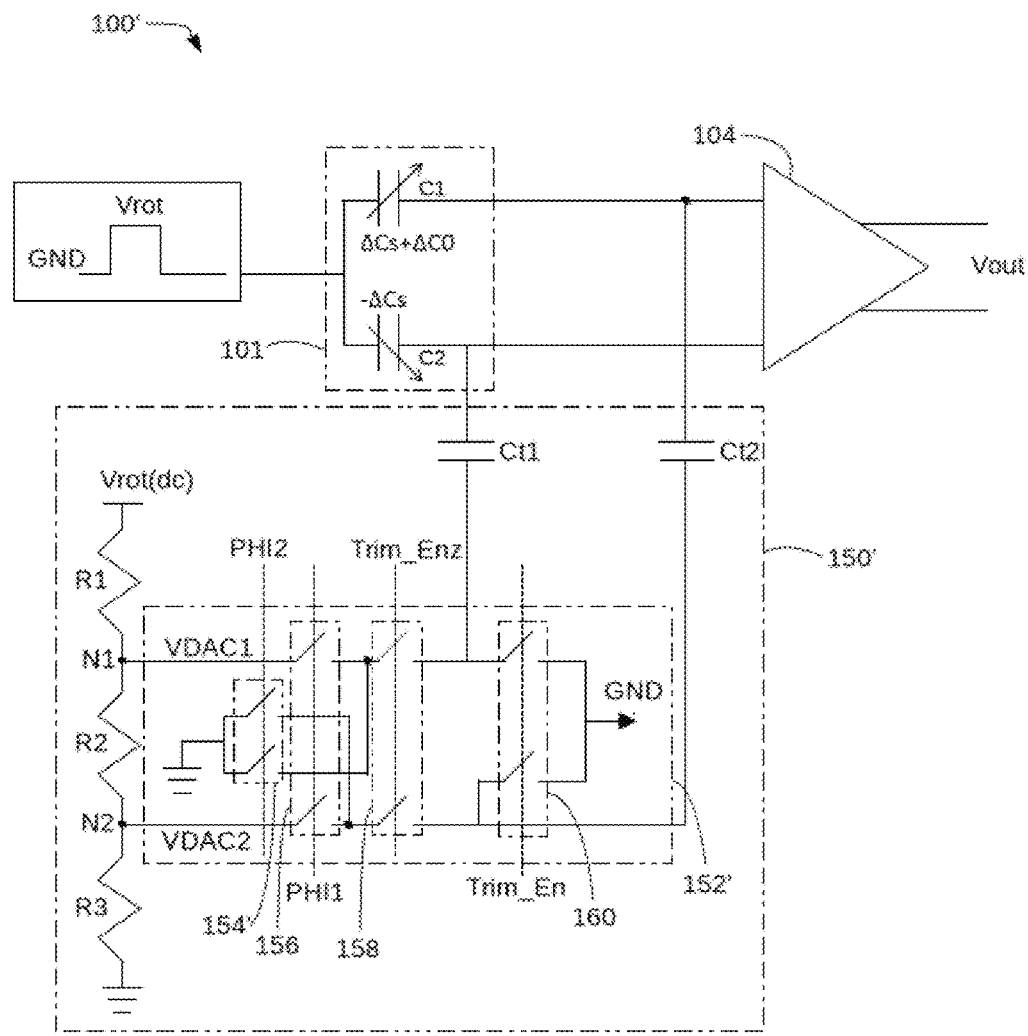
FIG. 2 is a schematic block diagram of another exemplary embodiment of an electronic device disclosed herein.

In order to further reduce noise, trim control may be utilized. As shown in FIG. 2, the DAC 150' may instead comprise a switched circuit 152' with first switches 154' that shunt the first and second nodes to ground as a function of the complement of the signal. The set of switches 156 operate as described above to couple the nodes N1 and N2 to the inputs of the DAC 150' as a function of the first control signal. The sets of switches 158 and 160 function to couple the first and second nodes N1 and N2 to a supply voltage Vcc as a function of a trim control signal.

In greater detail, the ΔC0 mismatch compensation as in FIG. 1 applies a differential signal from the R-DAC on both phases of PHI clock (PHI1 and PHI2) while the voltage Vrot driving the MEMS rotor is switched between Vrot and GND. In this case, noise is injected noise on the compensation capacitors Ct1 and Ct2 while C1 and C2 are connected to GND during PHI2. The circuit of FIG. 2, alleviates this issue and the signals are injected to C1/C2 and Ct1/Ct2 during PHI1 yet during the PHI2 phase are both grounded. Therefore, in this scheme noise cancellation (in particular, low frequency noise) is more effective.

Figures 3, 4:
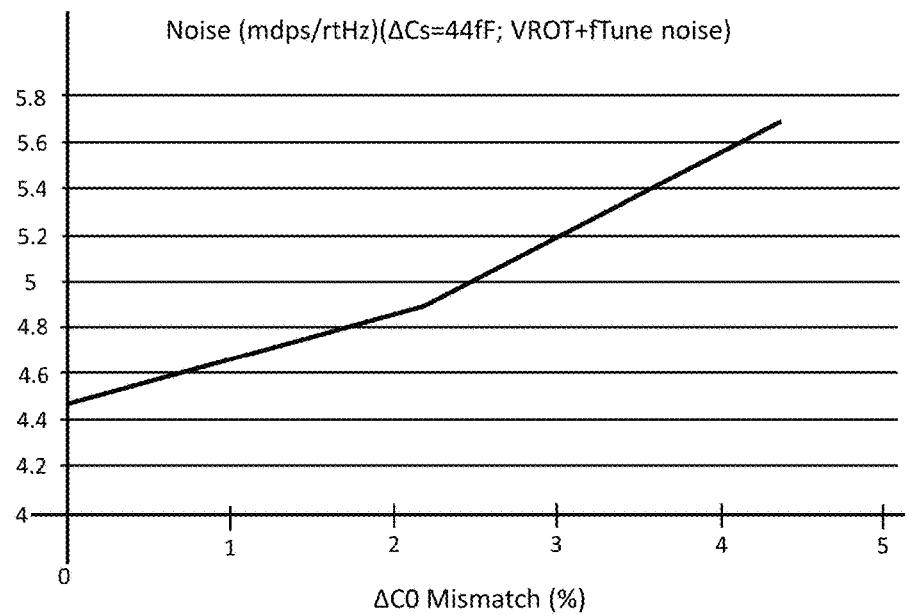
FIG. 3 is a graph showing how noise increased with capacitance mismatch.
FIG. 4 is a chart showing the amount of supply voltage single tone attenuation at different frequencies and for a given degree of compensation for the capacitance mismatch.

Shown in FIG. 3 is a noise simulation of a MEMS gyroscope with $\Delta C0$ as a variable. As can be seen, the noise increases with as the mismatch of the capacitance $\Delta C0$ increases. This may impose a limitation on the achievable sensitivity of the MEMS gyroscope. Therefore, reducing the mismatch $\Delta C0$ can greatly improve the performance of the system.

In order to illustrate the noise reduction provided by the DAC 150, a single frequency tone may be imposed on Vrot signal in order to represent a single noise frequency. It is desirable for the output of the capacitance to voltage amplifier 104 to cancel out as much of this tone as possible. The cancellation is as a function of the frequency and the amount of $\Delta C0$ cancellation provided by the DAC 150. FIG. 4 shows the amount of Vrot single tone attenuation at different frequencies and for a given degree of $\Delta C0$ cancellation.

Figure 5:
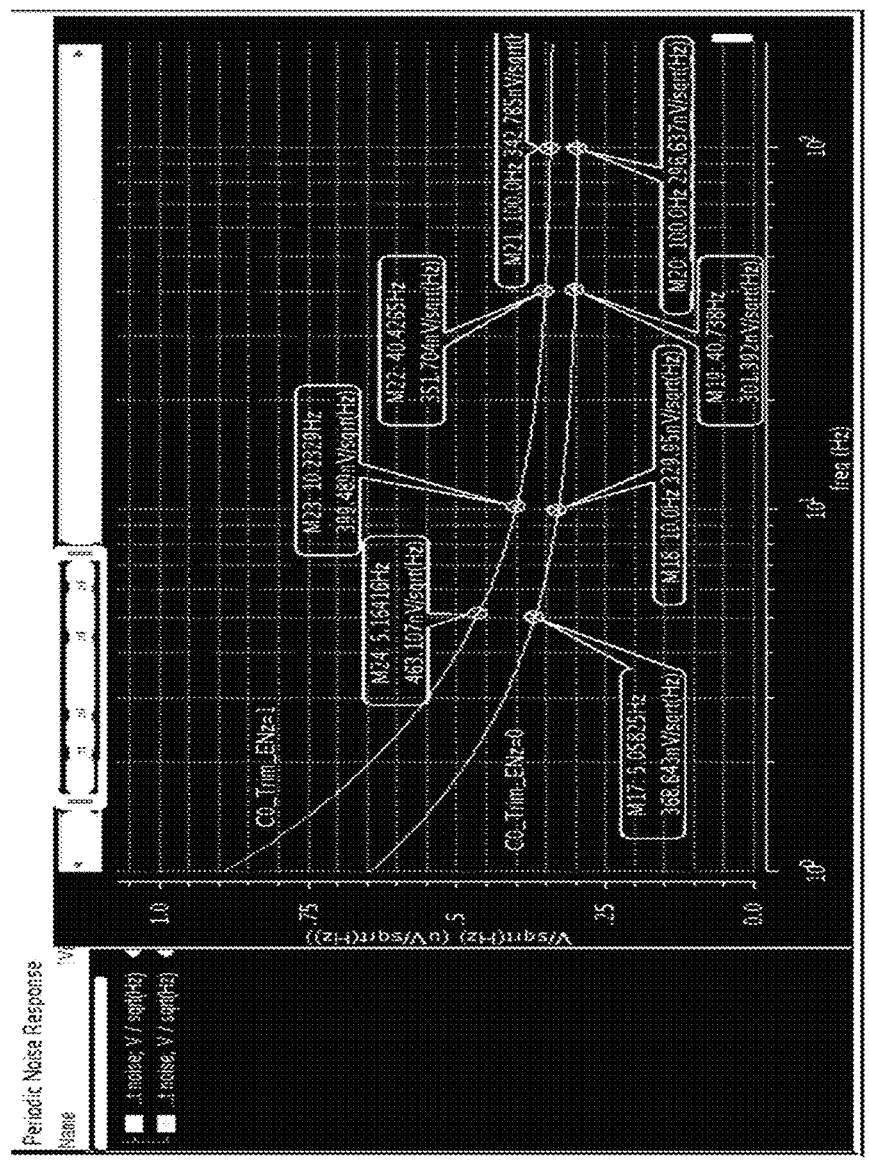
FIG. 5 is a graph showing system noise density with the compensation for the capacitance disabled and enabled.

In order to illustrate the noise cancellation with a white and 1/f noise density imposed on Vrot, the MEMS sensor 101 was subjected to periodic steady state (PSS) simulation while Vrot was subjected to such noise density. FIG. 5 shows the system noise density with the noise cancellation disabled and then enabled. It is clear from FIG. 5 that the DAC 150 has lowered the noise level of the system to the point where its noise is similar to that with an ideal Vrot. The degree of $\Delta C0$ cancellation depends on the degree of $\Delta C0$ trim achievable, with the embodiment of FIG. 2 therefore able to provide more $\Delta C0$ cancellation in some application.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. A device, comprising:
   a MEMS sensor coupled to a signal and configured to generate a first differential capacitance representing a change in capacitance from a first original sensing capacitance value and a second differential capacitance representing a change in capacitance from a second original sensing capacitance value, wherein the first and second original sensing capacitance values are mismatched;
   a compensation circuit configured to generate outputs for compensating the first and second differential capacitances for the mismatched capacitance values; and
   a capacitance to voltage converter configured to receive the first and second differential capacitances and the outputs of the compensation circuit and generate an output voltage as a function thereof;
   wherein the compensation circuit comprises a resistive digital to analog converter (DAC) selectively coupled to the signal and a power signal upon which the signal is based, the resistive DAC comprising:
      a first resistor coupled between the signal and a first node;
      a second resistor coupled between the first node and a second node; and
      a third resistor coupled between the second node and a ground.

2. The device of claim 1, wherein the mismatched capacitance values results in a DC offset; and wherein the compensation circuit is configured to generate a compensation signal opposite in sign to the DC offset.

3. The device of claim 1, wherein the mismatched capacitance values results in a charge injection to an input of the capacitance to voltage converter; and wherein the compensation circuit is configured to compensate the first and second differential capacitances by injecting a charge to the input of the capacitance to voltage converter that counteracts the charge injection that resulted from the mismatched capacitance values.

4. The device of claim 1, wherein a thermal noise of the resistive DAC is substantially less than noise from the signal.

5. The device of claim 1, wherein the resistive DAC further comprises a switched circuit configured to selectively couple the first and second nodes to the capacitance to voltage converter through first and second compensation capacitors, as a function of the signal.

6. The device of claim 5, wherein the capacitance to voltage converter has a non-inverting input and an inverting input; and wherein the switched circuit is further configured to couple the first and second nodes to the non-inverting input and the inverting input as a function of the signal.

7. The device of claim 6, wherein the switched circuit is further configured to couple the first and second nodes to the inverting input and the non-inverting input as a function of a complement of the signal.

8. The device of claim 5, wherein the switched circuit is further configured to couple the first and second nodes to a supply voltage as a function of a trim control signal.

9. The device of claim 1, wherein the MEMS sensor is configured to output the first and second differential capacitances as a function of a sensed condition of the device.

10. The device of claim 9, wherein the sensed condition of the device comprises at least one of an acceleration of the device and a physical orientation of the device.

11. A method, comprising:
   receiving a signal at a MEMS sensor;
   receiving from the MEMS sensor a first differential capacitance representing a change in capacitance from a first original sensing capacitance value and a second differential capacitance representing a change in capacitance from a second original sensing capacitance value, wherein the first and second original sensing capacitance values are mismatched;
   compensating the first and second differential capacitances for the mismatched capacitance values using a resistive digital to analog converter (DAC) selectively coupled to the signal and a power signal upon which the signal is based, the resistive DAC including a first resistor coupled between the signal and a first node, a second resistor coupled between the first node and a second node, and a third resistor coupled between the second node and a ground; and
   generating an output as a function of the first and second differential capacitances.

12. The method of claim 11, wherein the mismatched capacitance values results in a DC offset; and wherein the compensating the first and the second differential capacitances comprises generating a compensation signal opposite in sign to the DC offset.

13. The method of claim 11, wherein the mismatched capacitance values results in an unwanted charge injection;

and wherein the compensating the first and second differential capacitances comprises injecting a charge to counteract the unwanted charge injection.

14. A method, comprising:
- supplying a MEMS sensor having two non-stationary components that move with respect to a stationary component with a supply signal;
- measuring differential capacitances representing changes in capacitance from original sensing capacitance values, using a capacitance to voltage converter, wherein the original sensing capacitance values are mismatched; and
- using a compensation circuit supplied by the supply signal to compensate the differential capacitances for the mismatched capacitance values;
- wherein the compensation circuit is used to compensate the differential capacitances by selectively coupling first and second center tap nodes of a resistive divider to the differential capacitances through compensation capacitors as a function of the supply signal, the resistive divider being coupled between the supply signal and a ground and defining a resistive digital to analog converter (DAC).

15. The method of claim 14, wherein the compensation circuit is also used to compensate the differential capacitances by selectively coupling the first and second center tap nodes in different configurations to differential inputs of the capacitance to voltage converter as a function of the supply signal and a complement of the supply signal.

16. The method of claim 14, further comprising using the compensation circuit to reduce noise introduced by a rotor input signal fed to at least one of the non-stationary components via the selective coupling of the first and second center tap nodes; and wherein the noise reduction increases as a function of the compensation of the differential capacitances for the mismatched capacitance values.

* * * * *

UNITED STATES PATENT AND TRADEMARK OFFICE
CERTIFICATE OF CORRECTION

PATENT NO. : 10,274,510 B2
APPLICATION NO. : 15/019453
DATED : April 30, 2019
INVENTOR(S) : Milad Alwardi et al.

Page 1 of 1

It is certified that error appears in the above-identified patent and that said Letters Patent is hereby corrected as shown below:

In the Specification

At Column 5, Line 6, please replace [[ PHIL ]] with -- PHI1 --.

Signed and Sealed this
Twenty-fifth Day of February, 2020

Andrei Iancu
*Director of the United States Patent and Trademark Office*